(12) United States Patent
Howald

(10) Patent No.: US 6,400,458 B1
(45) Date of Patent: Jun. 4, 2002

(54) INTERFEROMETRIC METHOD FOR ENDPOINTING PLASMA ETCH PROCESSES

(75) Inventor: Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/409,840

(22) Filed: Sep. 30, 1999

(51) Int. Cl.[7] ............................................... G01B 11/02
(52) U.S. Cl. ........................ 356/496; 356/498; 356/511
(58) Field of Search ............................. 356/355; 438/16

(56) References Cited

U.S. PATENT DOCUMENTS

| | | | | |
|---|---|---|---|---|
| 4,317,698 A | * | 3/1982 | Christol et al. .............. 156/626 |
| 4,415,402 A | | 11/1983 | Gelernt ......................... 156/626 |
| 4,454,001 A | | 6/1984 | Sternheim et al. ........... 156/626 |
| 4,496,425 A | * | 1/1985 | Kuyel ........................... 156/626 |
| 4,618,262 A | | 10/1986 | Maydan et al. .............. 356/357 |
| 4,680,084 A | | 7/1987 | Heimann et al. ............ 156/626 |
| 4,782,219 A | * | 11/1988 | Crater .......................... 235/462 |
| 4,927,485 A | | 5/1990 | Cheng et al. ................. 156/345 |
| 4,953,982 A | | 9/1990 | Ebbing et al. ................ 356/357 |
| 5,077,464 A | | 12/1991 | Ebbing et al. ............ 250/201.4 |
| 5,151,584 A | | 9/1992 | Ebbing et al. ............ 250/201.4 |
| 5,337,144 A | | 8/1994 | Strul et al. ................... 356/357 |
| 5,355,217 A | | 10/1994 | Canteloup et al. ........... 356/357 |
| 5,361,137 A | * | 11/1994 | Aton et al. ................... 356/354 |
| 5,362,356 A | | 11/1994 | Schoenborn ................. 156/626 |
| 5,407,524 A | | 4/1995 | Patrick et al. ............... 156/627 |
| 5,450,205 A | * | 9/1995 | Sawin et al. ................. 356/382 |
| 5,578,161 A | | 11/1996 | Bernard Auda ........... 156/626.1 |
| 5,648,849 A | | 7/1997 | Canteloup et al. ........... 356/357 |
| 5,658,418 A | | 8/1997 | Coronel et al. .............. 156/345 |
| 6,077,387 A | | 6/2000 | Tesauro |

FOREIGN PATENT DOCUMENTS

| | | |
|---|---|---|
| JP | 01-183122 | 7/1989 |
| JP | 02-216818 | 8/1990 |
| JP | 08-068754 | 3/1996 |
| JP | 10-64884 | 3/1998 |
| JP | 11-67732 | 3/1999 |
| JP | 11-251252 | 9/1999 |

* cited by examiner

*Primary Examiner*—Frank G. Font
*Assistant Examiner*—Phil Natividad
(74) *Attorney, Agent, or Firm*—Martine & Penilla, LLP

(57) ABSTRACT

A method for monitoring a device fabrication process. The method includes etching into a wafer disposed inside a chamber and detecting the intensity of a portion of a light reflected from a surface of the wafer and further scattered at a scattering inside surface of the chamber.

11 Claims, 5 Drawing Sheets

US 6,400,458 B1

INTERFEROMETRIC METHOD FOR ENDPOINTING PLASMA ETCH PROCESSES

BACKGROUND OF THE INVENTION

This invention relates generally to plasma etch processes, and more particularly to an interferometric method and apparatus for monitoring a plasma etch process.

In the fabrication of integrated circuits, the removal of various layers or thin films of materials formed on a silicon wafer to define device patterns is commonly accomplished by means of an etching process. Etching techniques in use include wet, or chemical etching, and dry, or plasma etching. The latter technique is typically dependent upon the generation of reactive species from process gases that are impinged on the surface of the material to be etched. A chemical reaction takes place between the material and these species and the gaseous reaction product is then removed from the surface.

An important consideration in all etch processes is control of the extent to which the wafer is etched and determining a time, referred to as the endpoint, at which to end the process. Common methods for monitoring the etch process and determining the endpoint include spectroscopy and interferometry. Interferometric methods known in the prior art include laser interferometry and plasma emission interferometry as disclosed in U.S. Pat. No. 5,450,205 to Sawin et al. In the laser interferometric method, a laser beam I generated by laser 10 is directed through an optical window 12 and onto an area of a wafer 14 undergoing etching within a plasma chamber 16 as shown in FIG. 1. The intensity of the reflected beam R is detected by a detector 18 and recorded as a function of time. The detector may be a bandpass filter coupled with a silicon photodiode, a spectrometer, or a CCD camera.

When the material being etched is relatively transparent to the incident light, such as layer A as shown in FIG. 2, and overlies a reflective surface, such as layer B, the detected light intensity goes through a series of maxima and minima. As layer A is transparent to the incident light, the incident light is both reflected from the upper surface of the layer A and is refracted through the material. At the reflective surface of layer B, the refracted light is also reflected upwardly through layer A, exiting layer A to interfere with the light reflected from the upper surface of layer A. As layer A is etched, the optical path through layer A decreases in length resulting in varying interference patterns.

Plasma emission interferometry also analyzes the interference of light reflected from the surface of a wafer but uses etch reactor plasma optical emission as the light source. As shown in FIG. 3, incident light I' generated from plasma emission 20 formed within the plasma chamber 22 is reflected from the surface of a wafer 24 disposed within the chamber 22. The reflected light R' from the wafer 24 passes through an optical window 26 and is detected by a detector 28.

A plasma chamber 30 having a top portion 32 formed of a dielectric material transmissive to radiation is shown in FIG. 4. In the case where the dielectric material is transparent, such as fused silica, the top portion 32 can serve as an optical window 33. As shown, a light source 34 provides an incident beam I" which illuminates the surface of a wafer 36 through the optical window 33. The reflected light R" exits a plasma chamber 38 through the optical window 33 and is detected by detector 39. Although not shown, optical emission generated by the plasma may also be detected by the detector 39 in the case where no light source 34 is used.

A common problem with the prior art systems shown in FIGS. 1 and 3–4 relates to the difficulty in maintaining the optical quality of a window exposed to the plasma. The plasma either etches the window, in which case the window loses its clarity, or the plasma deposits material onto the window, which also leads to a loss of clarity. In the case of optical window 33 shown in FIG. 4, these problems are further exacerbated by the fact that a bottom surface 31 facing the plasma 35 of the top portion 32 is typically roughened. Deposited materials adhere better to roughened surfaces than to smooth surfaces and are less likely to flake off onto the wafer being etched. As a consequence of roughening the bottom surface 31, the optical window 33 becomes translucent rather than transparent and is not very useful for as an optical window for prior art interferometric monitoring methods.

A solution to maintaining the optical quality of a window is disclosed in pending application Ser. No. 09/282,519 to Ni et al. assigned to LAM Research Corporation. With reference to FIG. 5, a plasma chamber 40 includes a radiation transmissive top portion 42 having a recessed optical window 44 formed therethrough. Process gas flows into the plasma chamber 40 through an inlet 45 in communication with a prechamber 46, the prechamber being in communication with the interior of the plasma chamber 40. The flow of process gases prevents the plasma 47 from etching or depositing material on the optical window 44. Interferometry is then performed conventionally using a light source 48 and detector 49.

While the optical window 44 works optically well, it suffers from the disadvantage of increasing the cost of the fused silica dielectric window. In addition to the cost of machining a hole in the dielectric window to accommodate the prechamber 46, the window is structurally weakened by the machining of the hole. As the dielectric window serves as portion of a vacuum chamber, it must be made thicker to restore the loss in structural strength. This further increases the cost of the dielectric window and reduces the effectiveness of the dielectric window in coupling the radiation to the plasma. An additional drawback of the recessed window solution disclosed is that the top center of the plasma chamber is not the optimum location for the process gas feed for all purposes.

It would therefore be desirable to be able to detect interferometric signals from a wafer being etched without incurring the additional costs, shifting the process, or constraining the gas injection as is required by prior art methods of keeping the optical window clean.

SUMMARY OF THE INVENTION

The present invention provides an interferometric method and apparatus for monitoring a plasma etch process that interposes a diffusing or scattering element between the wafer and the detector. The diffusing or scattering element eliminates the need for a hard-to-maintain transparent optical window located in the top wall of the chamber. It either replaces the transparent window, or allows the transparent window to be moved from a position in the top wall of the chamber to a position in the side wall of the chamber, wherein the window is less susceptible to being degraded by high-density plasma.

More particularly, the present invention is embodied in a plasma chamber having a top wall formed of fused silica, the top wall having a top surface and a bottom surface facing the interior of the plasma chamber. In a first embodiment of the invention, light generated by plasma emission is reflected from the wafer, is scattered at the bottom surface of the top wall, and is transmitted through the top surface of the top wall. Detecting apparatus comprising a lens, optical fiber and a detector detect the light opposite the top wall from the wafer.

In another embodiment of the invention, a light source is provided for illuminating the wafer. Light from the light source passes through the top surface of the top wall and is diffused at the bottom surface of the top wall. The diffused light from the light source illuminates the wafer and is reflected from the wafer. The light reflected from the wafer illuminates the bottom surface of the top wall, is scattered by that surface and is transmitted through the top surface of the top wall. Detecting apparatus comprising a lens, optical fiber and a detector detect the light opposite the top wall from the wafer.

In another embodiment of the invention, a screen is disposed inside the plasma chamber. Light from plasma emission is reflected from the wafer, scattered from the screen and detected through a viewing window by a detecting apparatus.

In another embodiment of the invention, a screen is disposed inside the plasma chamber and a light source illuminates the wafer through a window. Light reflected from the wafer is scattered by the screen and is detected through a viewing window.

These and other advantages of the present invention will become apparent to those skilled in the art upon a reading of the following description of the invention and a study of the several figures of the drawings.

BRIEF DESCRIPTION OF THE DRAWINGS

The present invention will be readily understood by the following detailed description in conjunction with the accompanying drawings, with like reference numerals designating like elements.

DETAILED DESCRIPTION OF THE PREFERRED EMBODIMENTS

Figure 1:
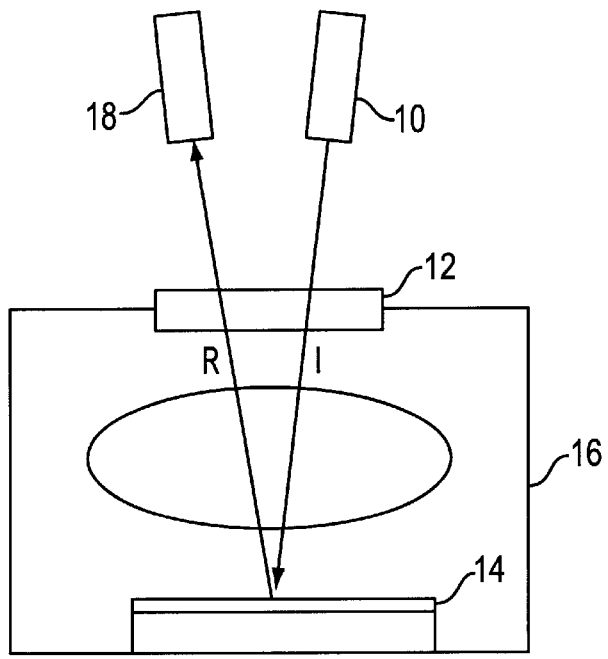
FIG. 1 is a schematic view of an interferometric apparatus of the prior art.
Figure 3:
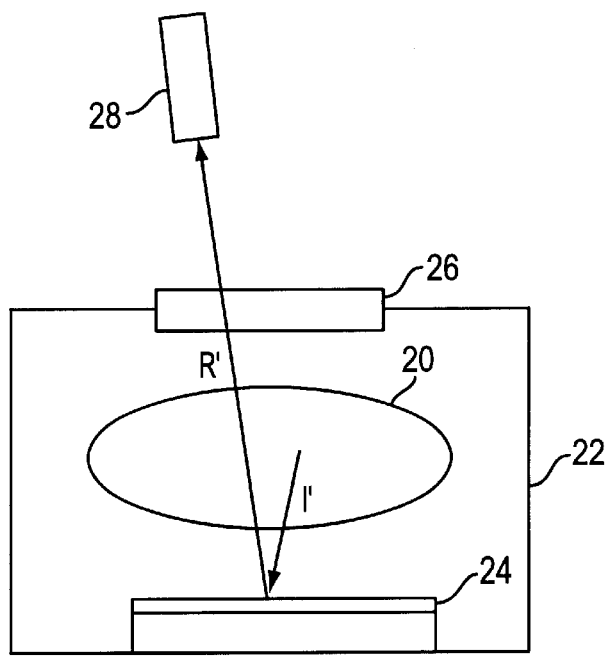
FIG. 3 is a schematic view of another interferometric apparatus of the prior art.
Figure 2:
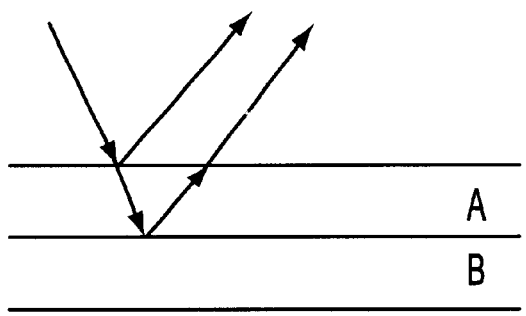
FIG. 2 is a graphical representation showing light both reflected and refracted to produce interference maxima and minima.
Figure 4:
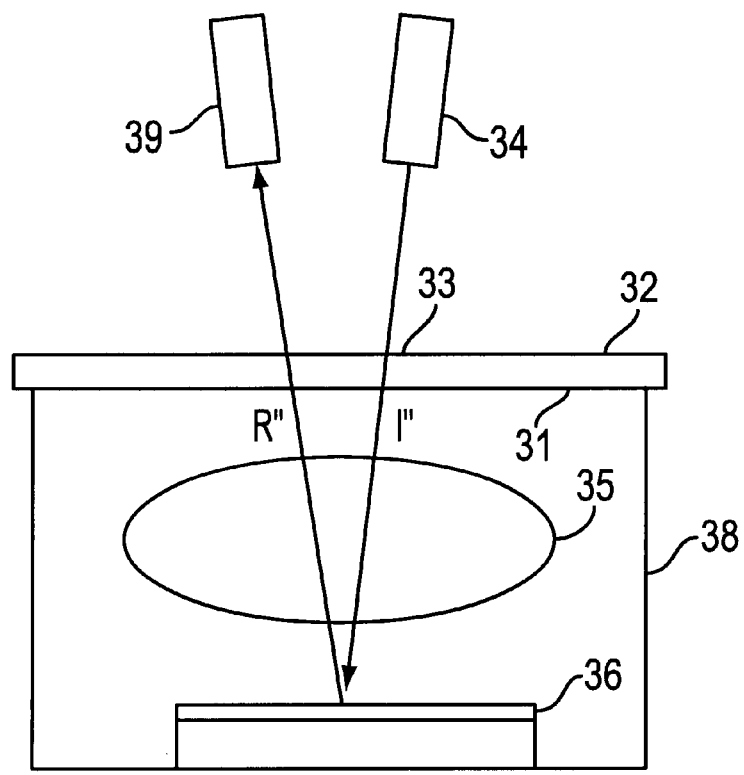
FIG. 4 is a schematic view of yet another interferometric apparatus of the prior art.
Figure 5:
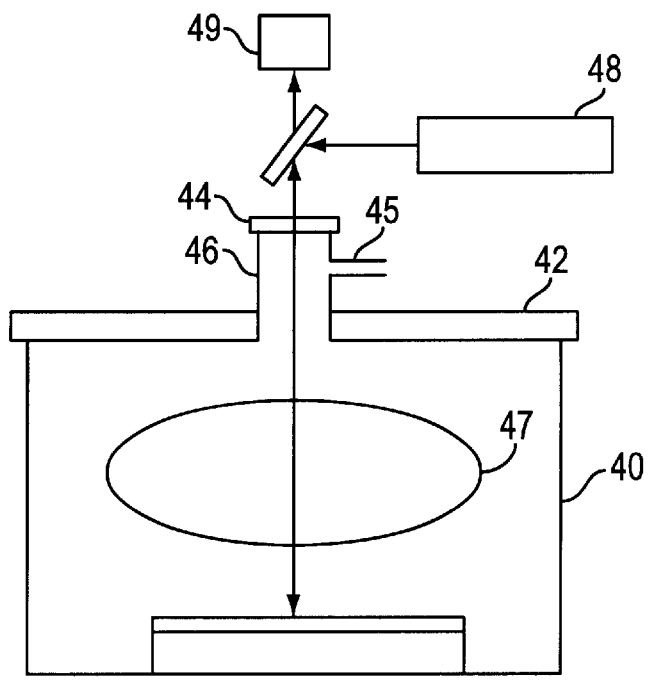
FIG. 5 is a schematic view of another interferometric apparatus of the prior art.
Figure 6:
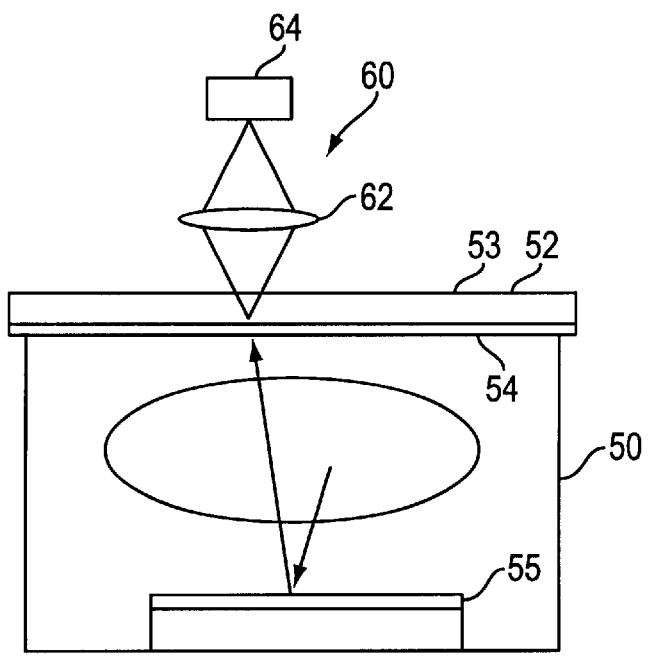
FIG. 6 is a schematic view of a first embodiment of the invention.
Figure 7:
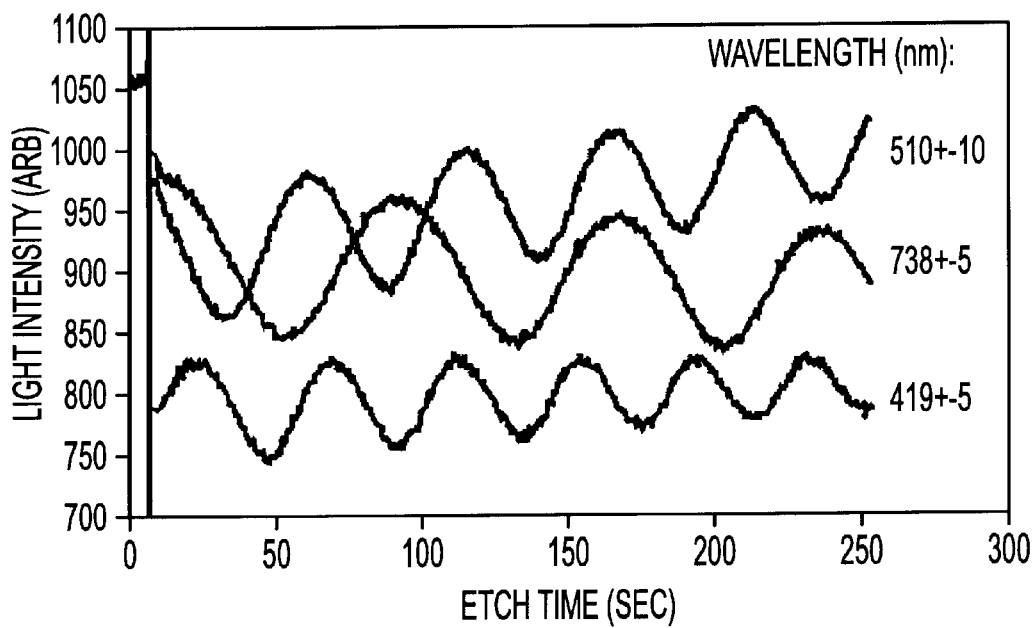
FIG. 7 is a graph showing interference patterns detected in accordance with the present invention.

In accordance with a first embodiment of the invention, a plasma chamber 50 comprises a top wall 52 formed of fused silica as shown in FIG. 6. Top wall 52 includes a roughened surface 54 which faces the interior of plasma chamber 50 and a top surface 53. The roughened surface 54 is provided to prevent material deposited on the roughened surface 54 from flaking off onto a wafer 55. A detecting apparatus, generally designated 60, is disposed outside of plasma chamber 50 and includes a lens 62 and a detector 64. Light generated by plasma emission is reflected from the wafer 55, scattered at the roughened surface 54 of the top wall 52 and transmitted through the top surface 53 of the top wall 52. The transmitted light is then detected by detecting apparatus 60. In this manner interference patterns such as those shown in FIG. 7 are detectable for use in monitoring the etch process.

During the plasma etch process, the roughened surface 54 undergoes localized etching and material deposition due to the positioning of a radiation inducing coil (not shown). The detecting apparatus 60 is preferably positioned at a location in such manner that the detected light is being transmitted through the location of the roughened surface 54 being etched. In this configuration, the detected light does not have to traverse material deposits which may be opaque. The effect of plasma etching on the roughened surface is typically to further roughen the surface. The additional roughening does not significantly alter the optical diffusing properties of the surface.

Figure 8:
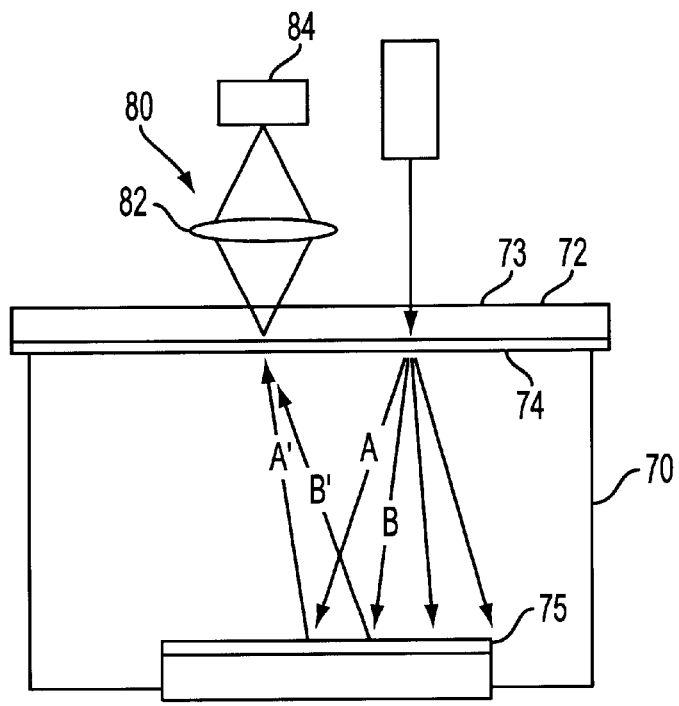
FIG. 8 is a schematic view of a second embodiment of the invention.

A second embodiment of the invention is shown in FIG. 8. A plasma chamber 70 comprises a top wall 72 formed of fused silica. The top wall 72 includes a roughened surface 74 which faces the interior of plasma chamber 70 and a top surface 73. The roughened surface 74 is provided to prevent material deposited on the roughened surface 74 from flaking off onto a wafer 75. A detecting apparatus, generally designated 80, is disposed outside of plasma chamber 70 and includes a lens 82 and a detector 84. Incident light provided by a light source 76 is scattered by the top wall 72, reflected from the wafer 55, scattered at the roughened surface 74 of the top wall 72, and transmitted through the top surface 73 of the top wall 72. The transmitted light is then detected by detecting apparatus 80. In this manner interference patterns are detectable for use in monitoring the etch process.

Figure 9:
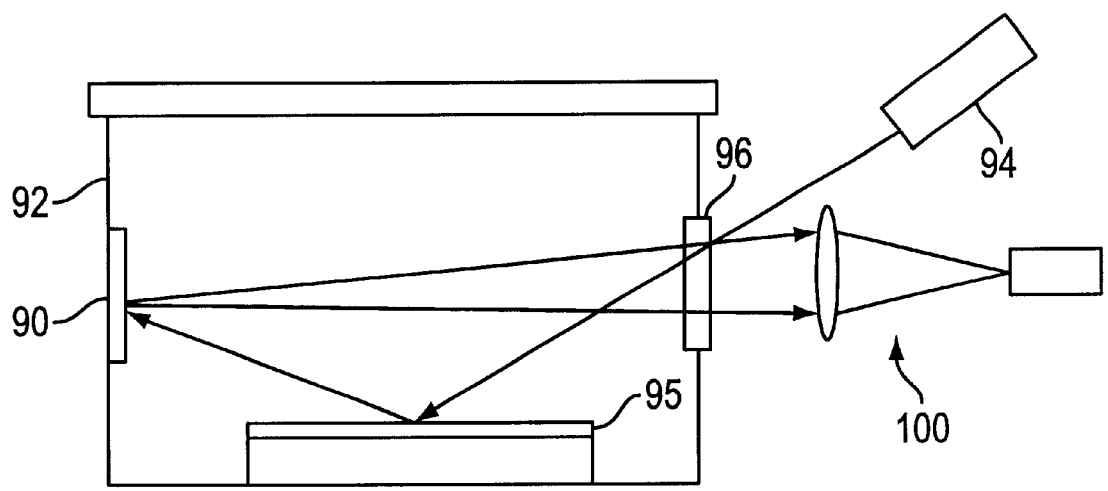
FIG. 9 is a schematic view of a third embodiment of the invention.

A third embodiment of the invention is shown in FIG. 9. A scattering screen 90, preferably a ceramic screen, is disposed within a plasma chamber 92. Incident light provided by a light source 94 is reflected from a wafer 95, scattered and reflected from the screen 90 and detected by a detecting apparatus generally designated 100 through a viewing window 96. In this manner interference patterns are detectable for use in monitoring the etch process.

Figure 10:
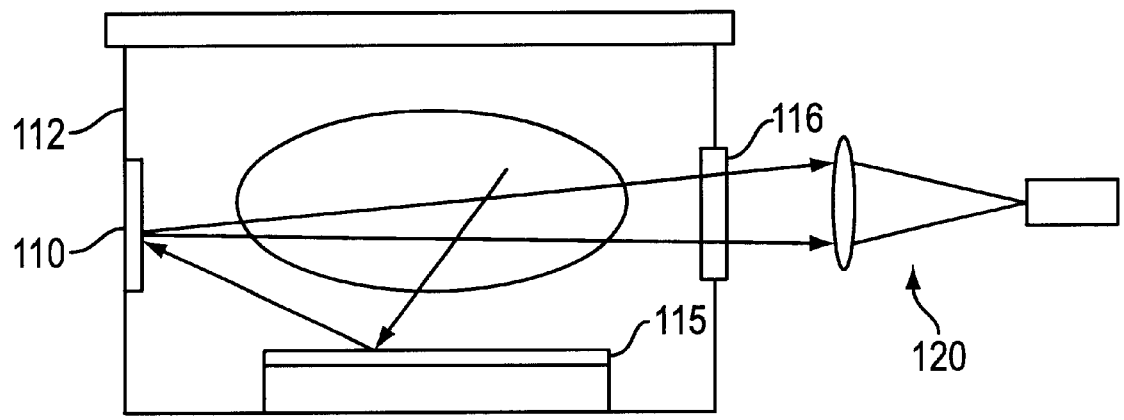
FIG. 10 is a schematic view of a fourth embodiment of the invention.

A fourth embodiment of the invention is shown in FIG. 10. A scattering screen 110, preferably a ceramic screen, is disposed within a plasma chamber 112. Light generated by plasma emission is reflected from the wafer 115, scattered and reflected from the screen 110 and detected by a detecting apparatus generally designated 120 through a viewing window 116. Window 116 is preferably located in the side wall of the chamber away from the region of highest plasma density near the top wall of the chamber. At this location, plasma etching of the window is greatly reduced and deposition of material onto the window can be controlled by standard methods such as heating the window. In this manner interference patterns are detectable for use in monitoring the etch process.

Although only a few embodiments of the present invention have been described in detail herein, it should be understood that the present invention may be embodied in many other specific forms without departing from the spirit or scope of the invention. In particular, while the detecting apparatus has been described as comprising a lens and a detector, the use of any optical detecting apparatus is within the scope of the invention. Therefore, the present examples and embodiments are to be considered as illustrative and not restrictive, and the invention is not to be limited to the details given herein, but may be modified within the scope of the appended claims.

What is claimed is:

1. A method of monitoring a device fabrication process comprising the steps of:

etching into a wafer disposed inside a chamber;

reflecting light off of the wafer;

passing a portion of the reflected light through a roughened surface of a wall of the chamber, the wall being capable of transmitting the light; and detecting the intensity of the transmitted light.

2. The method of claim 1 wherein the wall is a roughened fused silica window.

3. The method of claim 1 further comprising the step of illuminating the wafer.

4. A method of monitoring a device fabrication process comprising the steps of:

depositing a layer upon a wafer disposed inside a chamber;

reflecting light off of the wafer;

passing a portion of the reflected light through a roughened surface of a wall of the chamber, the wall being capable of transmitting the light; and detecting the intensity of the transmitted light.

5. The method of claim 4 wherein the wall is a roughened fused silica window.

6. The method of claim 4 further comprising the step of illuminating the wafer.

7. An apparatus for monitoring a wafer fabrication process comprising:

a chamber including a wall capable of transmitting light, the wall having a roughened surface; and a detecting apparatus operable to detect the intensity of a portion of a light reflected from a surface of the wafer and further scattered at the roughened surface.

8. The apparatus as recited in claim 7 wherein the wall is a roughened fused silica window.

9. The apparatus as recited in claim 7 further comprising an illuminating apparatus operable to illuminate the surface of the wafer.

10. An apparatus for monitoring a wafer fabrication process comprising:

a chamber;

a scattering screen disposed within the chamber; and a detecting apparatus substantially aimed towards the scattering screen and operable to detect the intensity of a portion of a light reflected from a surface of the wafer and further scattered by the scattering screen.

11. The apparatus as recited in claim 10 wherein said scattering screen is ceramic.

* * * * *